United States Patent
Kuo et al.

(10) Patent No.: US 10,535,947 B1
(45) Date of Patent: Jan. 14, 2020

(54) SIGNAL TRANSMISSION ASSEMBLY, FLOATING CONNECTOR, AND CONDUCTIVE TERMINAL OF FLOATING CONNECTOR

(71) Applicant: Greenconn Corp., New Taipei (TW)

(72) Inventors: Tsung-Lung Kuo, Taipei (TW); Jiun-Fu Ke, New Taipei (TW)

(73) Assignee: GREENCONN CORP., New Taipei (TW)

(*) Notice: Subject to any disclaimer, the term of this patent is extended or adjusted under 35 U.S.C. 154(b) by 0 days.

(21) Appl. No.: 16/297,723

(22) Filed: Mar. 11, 2019

(51) Int. Cl.
| | |
|---|---|
| *H01R 12/00* | (2006.01) |
| *H01R 13/405* | (2006.01) |
| *H01R 12/71* | (2011.01) |
| *H01R 12/70* | (2011.01) |
| *H01R 13/631* | (2006.01) |
| *H05K 1/18* | (2006.01) |
| *H01R 12/91* | (2011.01) |

(52) U.S. Cl.
CPC ......... *H01R 13/405* (2013.01); *H01R 12/707* (2013.01); *H01R 12/716* (2013.01); *H01R 12/91* (2013.01); *H01R 13/6315* (2013.01); *H05K 1/181* (2013.01); *H05K 2201/10189* (2013.01)

(58) Field of Classification Search
CPC .. H01R 23/725; H01R 23/722; H01R 23/684; H05K 7/1023; H05K 7/1038
USPC ......... 439/74, 71, 70–73, 330–331, 525–526
See application file for complete search history.

(56) References Cited

U.S. PATENT DOCUMENTS

| | | | | |
|---|---|---|---|---|
| 6,986,670 | B2* | 1/2006 | Okura | H01R 13/6275 439/74 |
| 7,070,423 | B2* | 7/2006 | Zhang | H01R 13/41 439/74 |
| 7,128,581 | B2* | 10/2006 | Igarashi | H01R 12/716 439/74 |
| 7,575,441 | B1* | 8/2009 | Huang | H01R 12/716 439/74 |
| 7,766,666 | B1* | 8/2010 | Chen | H01R 12/716 439/65 |
| 9,853,403 | B1* | 12/2017 | Chen | H01R 12/716 |

* cited by examiner

*Primary Examiner* — Phuong Chi Thi Nguyen
(74) *Attorney, Agent, or Firm* — Li & Cai Intellectual Property Office

(57) ABSTRACT

A floating connector includes an insulating housing and conductive terminals. Each conductive terminal has a first portion and a second portion extending from the first portion. Each first portion is inserted into the insulating housing and includes a contacting segment that is at least partially exposed from the insulating housing. Each second portion does not contact with the insulating housing and includes a soldering segment. In each of the conductive terminals, a signal transmission path is defined between the contacting segment and the soldering segment, a frequency adjusting path is defined between the soldering segment and a position of the second portion that is connected to the first portion, and a length of the frequency adjusting path is 40%-60% of a length of the signal transmission path, so that each of the conductive terminals can transmit a high-frequency signal satisfying the SAS 3.0 standard.

10 Claims, 11 Drawing Sheets

SIGNAL TRANSMISSION ASSEMBLY, FLOATING CONNECTOR, AND CONDUCTIVE TERMINAL OF FLOATING CONNECTOR

FIELD OF THE DISCLOSURE

The present disclosure relates to a connector, and more particularly to a signal transmission assembly, a floating connector, and a conductive terminal of a floating connector.

BACKGROUND OF THE DISCLOSURE

A conventional floating connector includes an inserted chamber and a plurality of conductive terminals fixed in the inserted chamber. The inserted chamber is movable relative to the conductive terminals, and the conductive terminals can provide buffering force to the inserted chamber, thereby achieving a shockproof effect. However, the conductive terminals of the conventional floating connector are not suitable for transmitting a high-frequency signal (e.g., a high-frequency signal satisfying the SAS 3.0 standard).

SUMMARY OF THE DISCLOSURE

In response to the above-referenced technical inadequacies, the present disclosure provides a signal transmission assembly, a floating connector, and a conductive terminal of a floating connector to effectively improve the issues associated with conductive terminals of conventional floating connectors.

In one aspect, the present disclosure provides a signal transmission assembly, which includes a circuit board and a floating connector fixed on the circuit board. The floating connector includes an insulating housing and a plurality of conductive terminals. The insulating housing has an inserted groove. The conductive terminals each have a first portion and a second portion extending from the first portion. The first portion of each of the conductive terminals is inserted into the insulating housing and includes a contacting segment that is at least partially exposed from the inserted groove. The second portion of each of the conductive terminals does not contact with the insulating housing and includes a soldering segment. The soldering segments of the conductive terminals are soldered on the circuit board. In each of the conductive terminals, a signal transmission path is defined between the contacting segment and the soldering segment, a frequency adjusting path is defined between the soldering segment and a position of the second portion that is connected to the first portion, and a length of the frequency adjusting path is 40%-60% of a length of the signal transmission path, so that each of the conductive terminals is configured to transmit a high-frequency signal satisfying the SAS 3.0 standard.

In one aspect, the present disclosure provides a floating connector for the SAS 3.0 standard, which includes an insulating housing and a plurality of conductive terminals. The insulating housing has an inserted groove. The conductive terminals each have a first portion and a second portion extending from the first portion. The first portion of each of the conductive terminals is inserted into the insulating housing and includes a contacting segment that is at least partially exposed from the inserted groove. The second portion of each of the conductive terminals does not contact with the insulating housing and includes a soldering segment. In each of the conductive terminals, a signal transmission path is defined between the contacting segment and the soldering segment, a frequency adjusting path is defined between the soldering segment and a position of the second portion that is connected to the first portion, and a length of the frequency adjusting path is 40%-60% of a length of the signal transmission path, so that each of the conductive terminals is configured to transmit a high-frequency signal satisfying the SAS 3.0 standard.

In one aspect, the present disclosure provides a conductive terminal of a floating connector integrally formed as a single stamped piece, and all surfaces of the conductive terminal are provided without being stretched or folded. The conductive terminal includes a first portion and a second portion. The first portion includes a contacting segment for being abutted against a mating terminal. The second portion extends from the first portion, and includes a soldering segment for being soldered on a circuit board. A signal transmission path is defined between the contacting segment and the soldering segment, a frequency adjusting path is defined between the soldering segment and a position of the second portion that is connected to the first portion, and a length of the frequency adjusting path is 40%-60% of a length of the signal transmission path, so that each of the conductive terminals is configured to transmit a high-frequency signal satisfying the SAS 3.0 standard.

Therefore, the signal transmission assembly or the floating connector of the present disclosure is provided with not only a better shockproof effect, but also can be used to transmit a high-frequency signal satisfying the SAS 3.0 standard by the structural design of the conductive terminal (e.g., the length of the frequency adjusting path is 40%-60% of the length of the signal transmission path).

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the following detailed description and accompanying drawings.

DETAILED DESCRIPTION OF THE EXEMPLARY EMBODIMENTS

Figure 1:
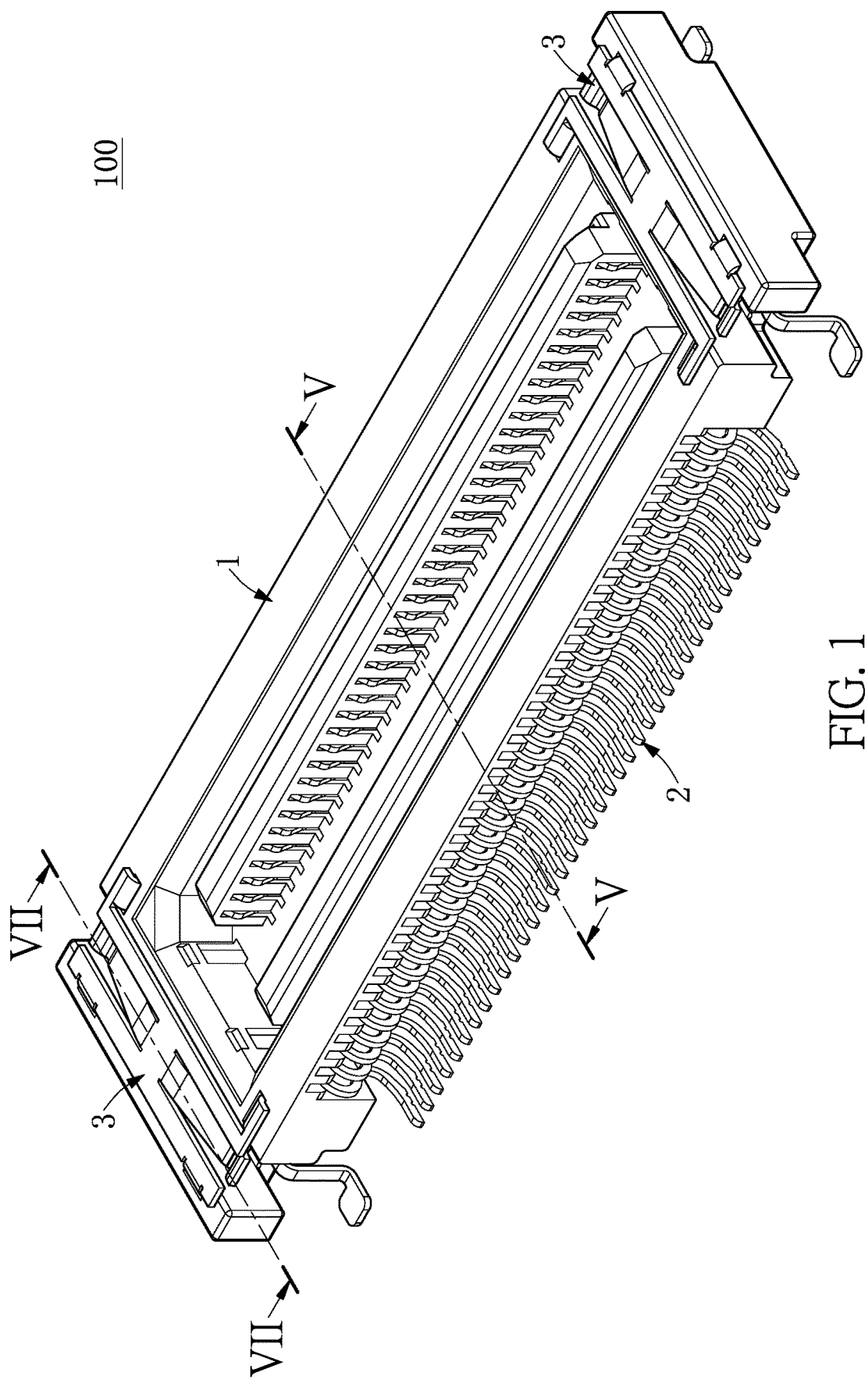
FIG. 1 is a perspective view of a floating connector according to an embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
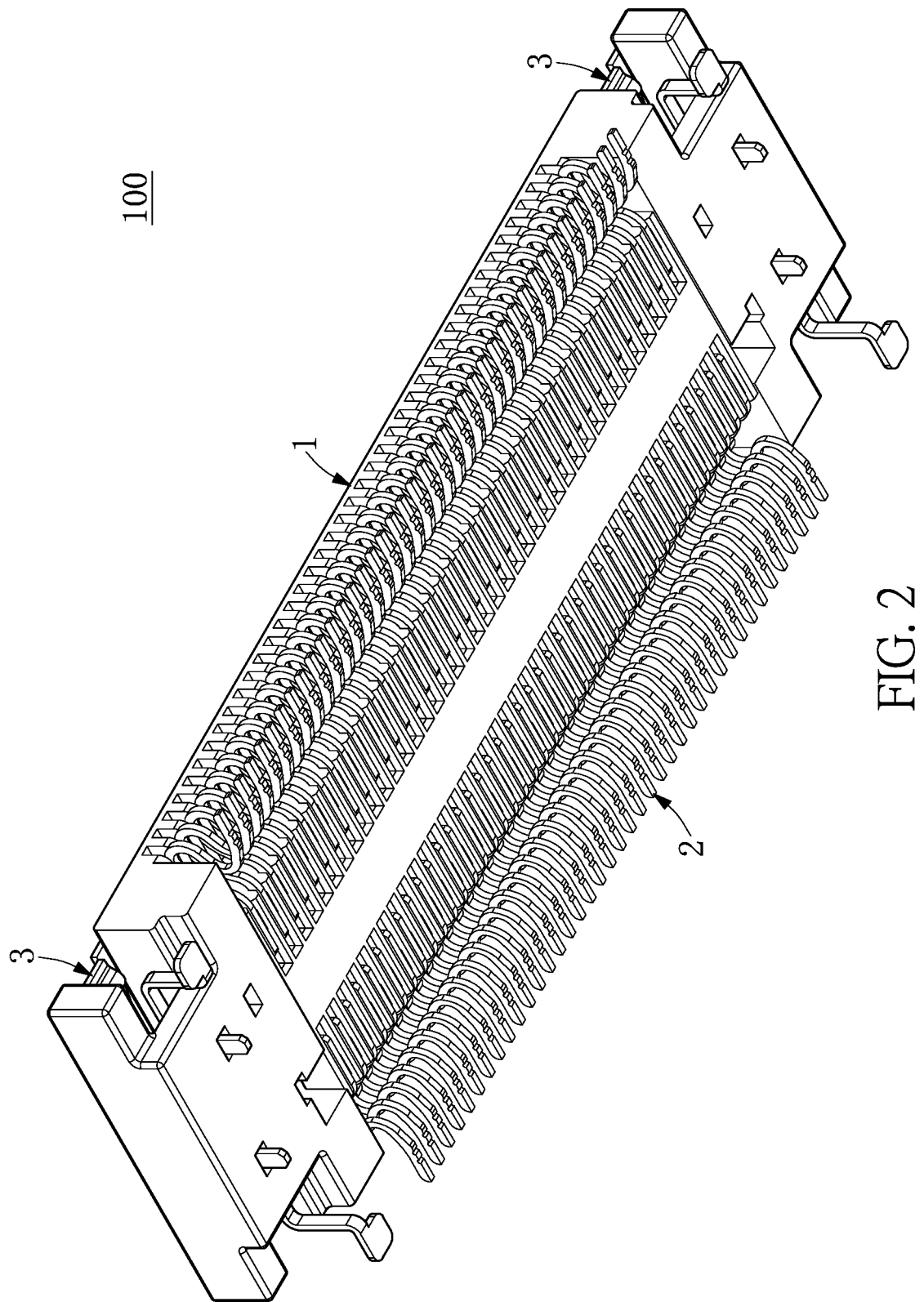
FIG. 2 is a perspective view of FIG. 1 from another angle.

Referring to FIG. 1 to FIG. 11, an embodiment of the present disclosure provides a floating connector 100. As shown in FIG. 1 and FIG. 2, the floating connector 100 is provided for an insertion of a mating connector (not shown), and is applied to a movable object (e.g., a vehicle). When the floating connector 100 and the mating connector move relative to each other, the electrical connection between the floating connector 100 and the mating connector can be firmly maintained by the structural design of the floating connector 100.

The floating connector 100 includes an insulating housing 1, a plurality of conductive terminals 2 fastened to the insulating housing 1, and two fixing modules 3 movably fastened to the insulating housing 1. It should be noted that, while the conductive terminal 2 of the present embodiment is in cooperation with the insulating housing 1, the conductive terminal 2 in other embodiments of the present disclosure can be independently sold or can be sold together with other components. The following description discloses the structure and relationship connection of each component of the floating connector 100, before the floating connector 100 is soldered onto any objects (e.g., a circuit board).

Figure 3:
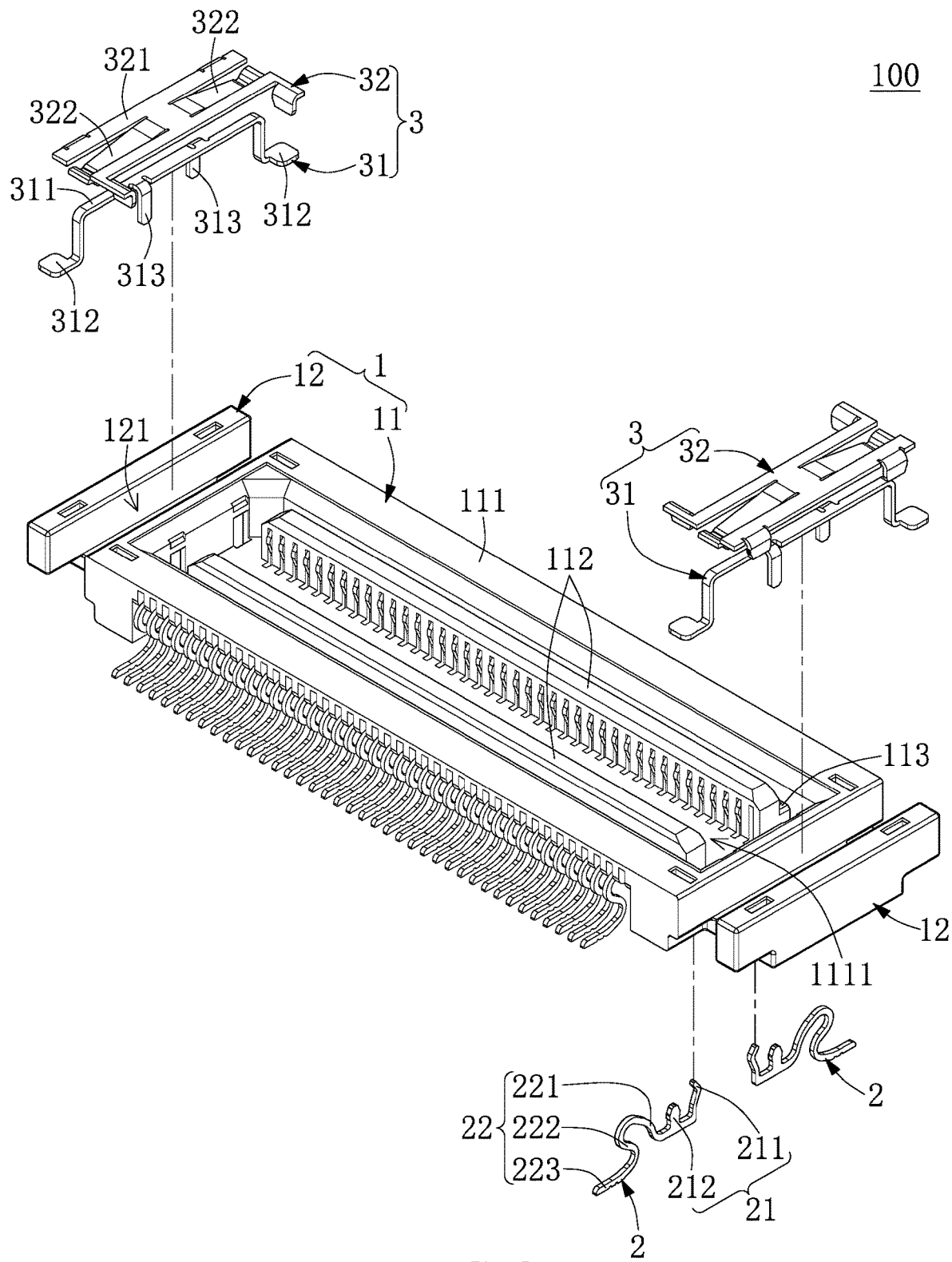
FIG. 3 is an exploded view of FIG. 1.
Figure 4:
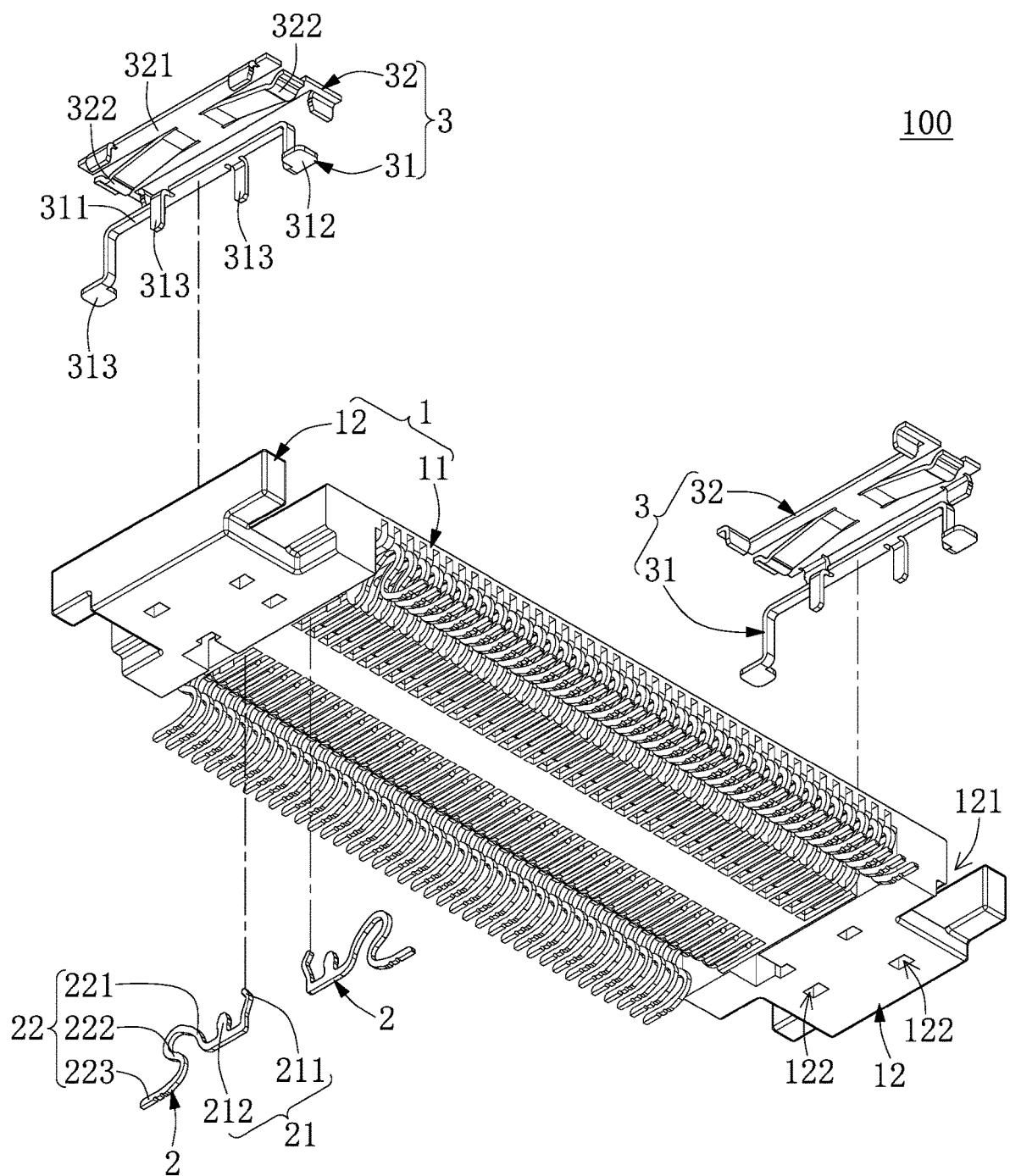
FIG. 4 is an exploded view of FIG. 2.
Figure 5:
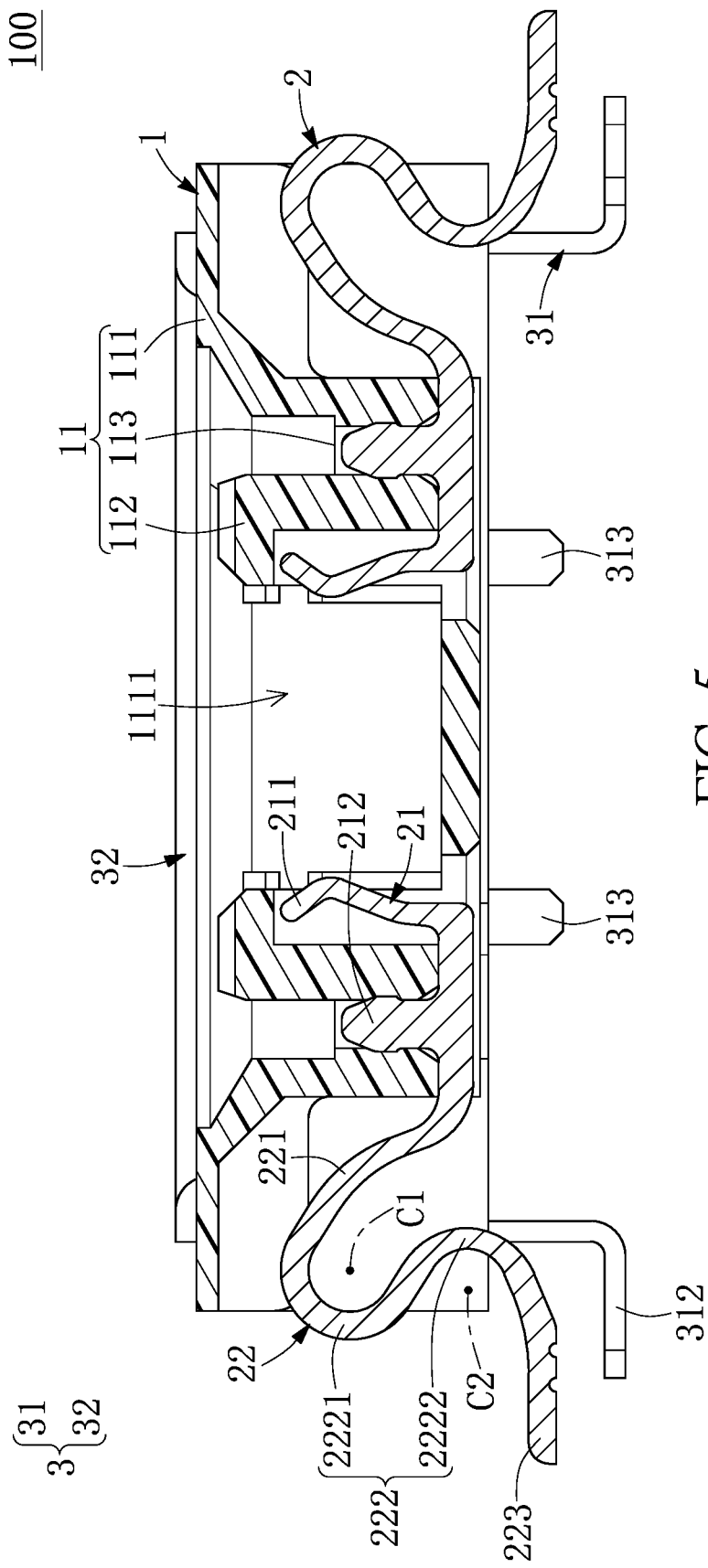
FIG. 5 is a cross-sectional view taken along the cross-sectional line V-V of FIG. 1.

As shown in FIG. 3 to FIG. 5, the insulating housing 1 in the present embodiment is integrally formed as a single piece. The insulating housing 1 includes an elongated inserted portion 11 and two end portions 12 respectively connected to two opposite ends of the inserted portion 11. The inserted portion 11 includes a main body 111, two tongue boards 112, and two retaining portions 113. The main body 111 has an inserted groove 1111 formed in an inner side thereof. The two tongue boards 112 are spaced apart from each other and perpendicularly extend from a bottom of the inserted groove 1111, and each of the tongue boards 112 does not protrude from an opening of the inserted groove 1111. The two retaining portions 113 extend from the bottom of the inserted groove 1111, and respectively connect the two tongue boards 112 to two inner side walls of the main body 111.

The two end portions 12 are respectively connected to two ends of the inserted portion 11 (e.g., a left end and a right end of the inserted portion 11 shown in FIG. 3) that are located in a longitudinal direction of the inserted portion 11. Each of the two end portions 12 has an accommodating slot 121, and an opening of the accommodating slot 121 of each of the two end portions 12 and the opening of the inserted groove 1111 face the same side (e.g., an upper side shown in FIG. 3). Moreover, each of the two end portions 12 has two thru-holes 122 penetrating through a bottom of the accommodating slot 121 thereof in a staggered arrangement.

Figure 6:
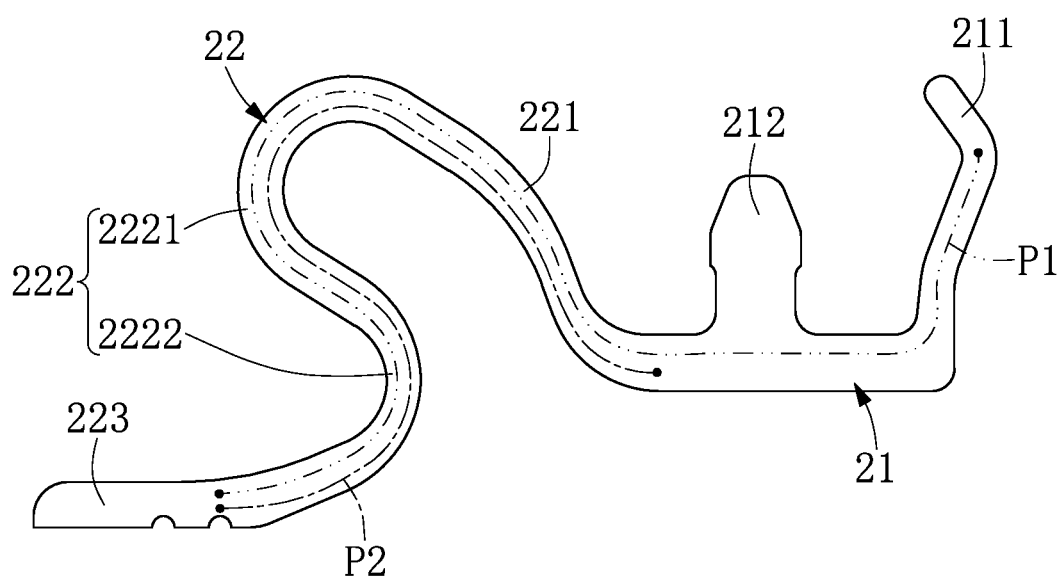
FIG. 6 is a planar view of a conductive terminal shown in FIG. 3.

As shown in FIG. 3, FIG. 5, and FIG. 6, the conductive terminals 2 are fastened to the inserted portion 11 of the insulating housing 1, and are arranged in two rows each parallel to the longitudinal direction of the inserted portion 11. The two rows of the conductive terminals 2 are respectively fastened to the two tongue boards 112 of the insulating housing 1, and are respectively fixed to the two retaining portions 113. Each of the conductive terminals 2 includes a first portion 21 inserted into the inserted portion 11 of the insulating housing 1 and a second portion 22 extending from the first portion 21 and not in contact with the inserted portion 11 of the insulating housing 1.

As the two rows of the conductive terminals 2 of the present embodiment are in a mirror symmetrical arrangement, and the conductive terminals 2 are of the same structure, the following description discloses the structure of just one of the conductive terminals 2 and a corresponding structure (e.g., the corresponding tongue board 112 and the corresponding retaining portion 113) of the inserted portion 11 for the sake of brevity. In other embodiments of the present disclosure, the conductive terminals 2 can have different structures from each other or from the structures disclosed in the following description.

As shown in FIG. 5 and FIG. 6, the conductive terminal 2 in the present embodiment is integrally formed as a single stamped piece without stretching or folding any of the surfaces of the conductive terminals 2, so that the conductive terminal 2 can be precisely formed in a predetermined structure that is suitable to transmit a high-frequency signal. On the other hand, if the conductive terminal is formed by bending a metallic strip, an inner surface of a bending portion of the conductive terminal is squeezed to form wrinkles, and an outer surface of the bending portion of the conductive terminal is stretched, so that the conductive terminal formed by being bent is not suitable for transmitting a high-frequency signal.

In the present embodiment, the first portion 21 of the conductive terminal 2 includes a contacting segment 211 and a fixing segment 212 connected to the contacting segment 211. The second portion 22 includes an extending segment 221 connected to the fixing segment 212 of the first portion 21, an S-shaped elastic segment 222 connected to the extending segment 221, and a soldering segment 223 connected to the S-shaped elastic segment 222. In other words, two opposite ends of the fixing segment 212 are respectively connected to a bottom end of the contacting segment 211 and an end of the extending segment 221 (e.g., a right end of the extending segment 221 shown in FIG. 6), and two opposite ends of the S-shaped elastic segment 222 are respectively connected to the other end of the extending segment 221 (e.g., a left end of the extending segment 221 shown in FIG. 6) and the soldering segment 223 (e.g., a right end of the soldering segment 223 shown in FIG. 6). The extending segment 221 and the S-shaped elastic segment 222 are elastically deformable and movable with respect to the first portion 21 and the soldering segment 223.

Specifically, the contacting segment 211 is disposed in the tongue board 112, and is at least partially exposed from the inserted groove 1111 for being abutted against a terminal of the mating connector. A part of the fixing segment 212 is fixed in the bottom of the main body 111, and is engaged with the retaining portion 113. It should be noted that the connection between the conductive terminal 2 and insulating housing 1 in the present embodiment is mainly established by engaging the fixing segment 212 with the retaining portion 113, but the manner of connection can be adjusted in other embodiments of the present disclosure according to design requirements.

Moreover, the extending segment 221 and the fixing segment 212 have an obtuse angle therebetween, and the extending segment 221 is arranged outside of the inserted portion 11 (or the inserted groove 1111). The S-shaped elastic segment 222 is arranged outside of the inserted portion 11, and includes a first curved segment 2221 and a second curved segment 2222 connected to the first curved segment 2221. The first curved segment 2221 is connected to the extending segment 221, the second curved segment 2222 is connected to the soldering segment 223, and a radius of curvature of the first curved segment 2221 is preferably 90%-110% of a radius of curvature of the second curved segment 2222, but the present disclosure is not limited thereto. In addition, when the S-shaped elastic segment 222 is orthogonally projected onto the end portion 12, a center of curvature C1 of the first curved segment 2221 and a center of curvature C2 of the second curved segment 2222 are located on the insulating housing 1.

The soldering segment 223 is arranged outside of the inserted portion 11. The soldering segment 223 in the present embodiment is a structure applicable to a surface mounting technology (SMT), but the present disclosure is not limited thereto. In other embodiments of the present disclosure, the soldering segment 223 can be a structure applicable for being inserted into and soldered with a circuit board.

It should be noted that, a signal transmission path P1 is defined between the contacting segment 211 and the soldering segment 223, a frequency adjusting path P2 is defined between the soldering segment 223 and a position of the second portion 22 (e.g., the end of the extending segment 221 connected to the fixing segment 212) that is connected to the first portion 21, and a length of the frequency adjusting path P2 is 40%-60% of a length of the signal transmission path P1, so that the conductive terminal 2 can be configured to transmit a high-frequency signal satisfying the SAS 3.0 standard. In the present embodiment, the conductive terminal 2 is configured to transmit a high-frequency signal having a band within a range of 10 GHz-15 GHz, but the present disclosure is not limited thereto.

Figure 7:
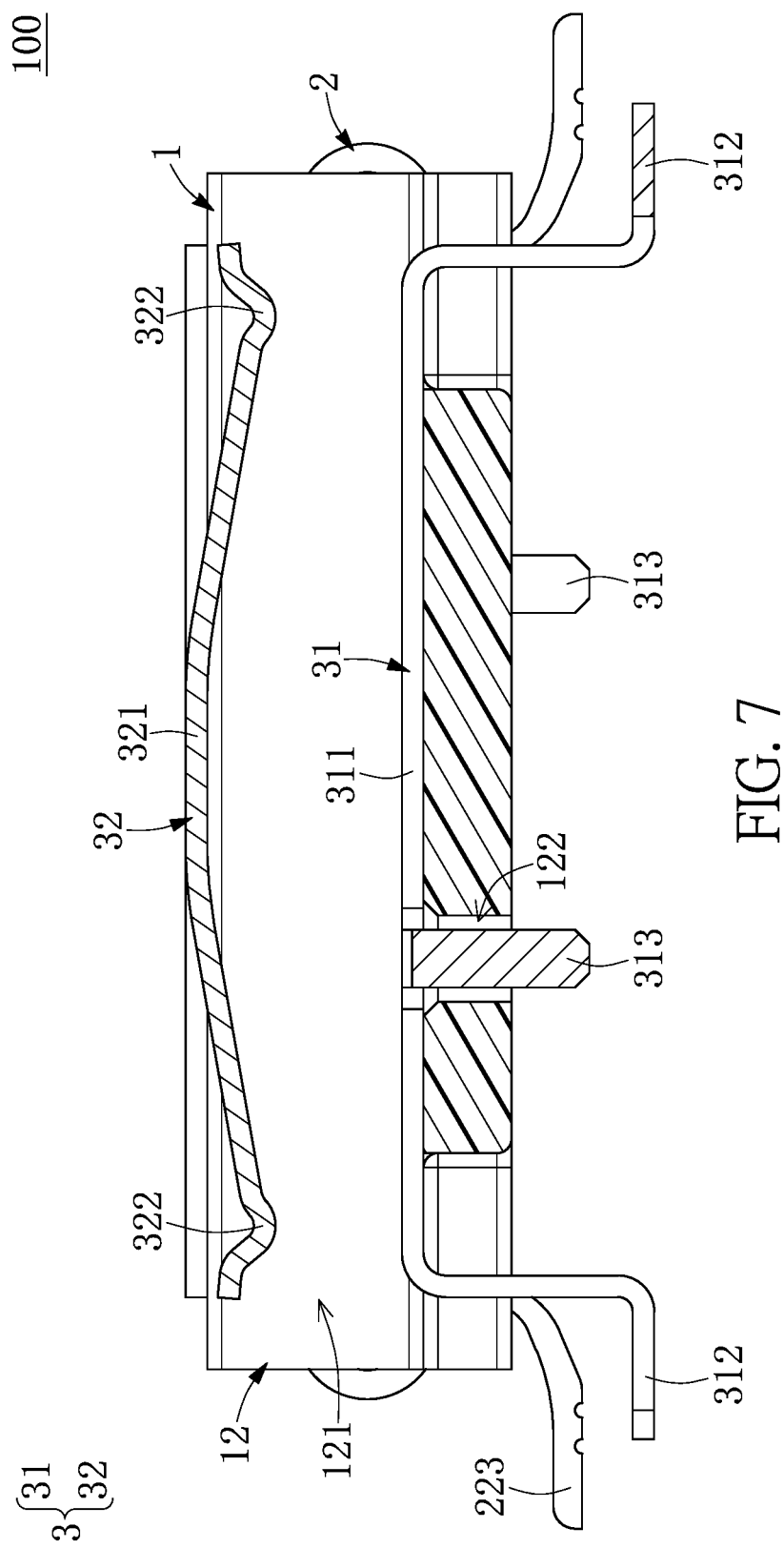
FIG. 7 is a cross-sectional view taken along the cross-sectional line VII-VII of FIG. 1.
Figure 8:
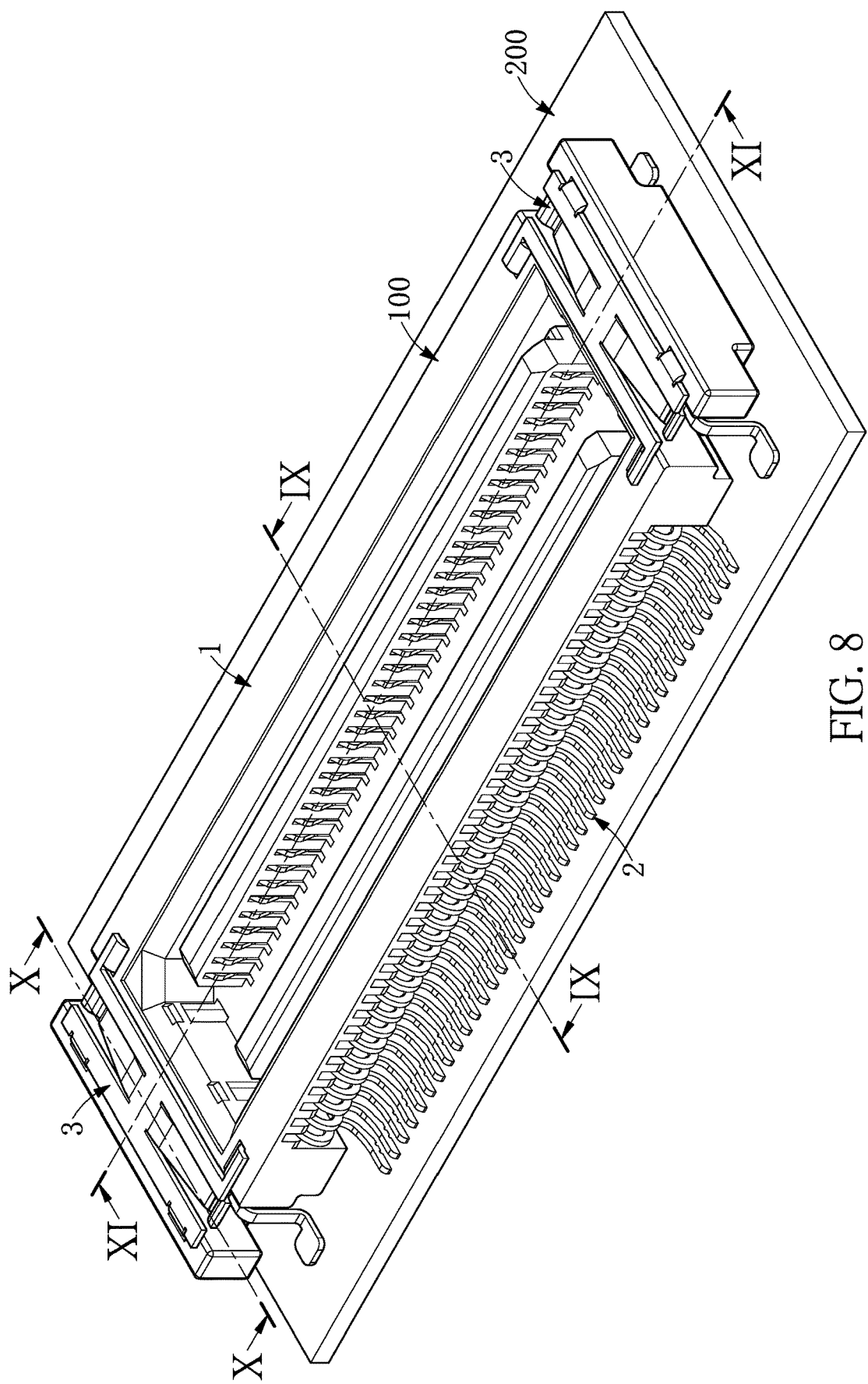
FIG. 8 is a perspective view of a signal transmission assembly according to the embodiment of the present disclosure.
Figure 9:
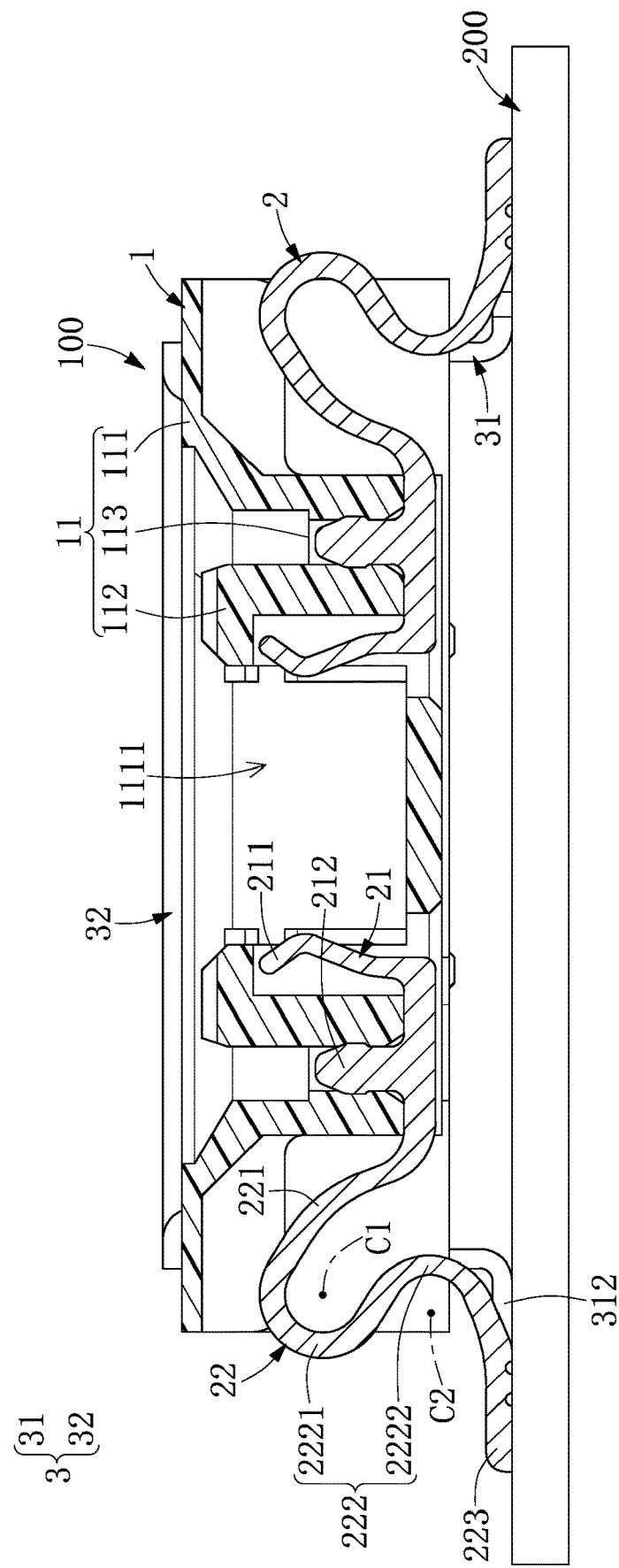
FIG. 9 is a cross-sectional view taken along the cross-sectional line IX-IX of FIG. 8.

As shown in FIG. 3, FIG. 4, and FIG. 7, the two fixing modules 3 are respectively fastened to two end portions 12 of the insulating housing 1. As the two fixing modules 3 are of the same structure, the following description discloses the structure of just one of the two fixing modules 3 and the corresponding end portion 12 for the sake of brevity. In other embodiments of the present disclosure, the two fixing modules 3 can have different structures from each other or from the structures disclosed in the following description.

The fixing module 3 includes a fixing member 31 and a limiting member 32. The fixing member 31 is movably inserted into a bottom of the accommodating slot 121 of the end portion 12, and is integrally formed as a single piece. Moreover, the limiting member 32 is fixed on the end portion 12, and is located at one side of the fixing member 31 (e.g., an upper side of the fixing member 31 shown in FIG. 3). In the present embodiment, the limiting member 32 is integrally formed as a single piece, and covers at least part of the opening of the accommodating slot 121 of the end portion 12.

Specifically, as shown in FIG. 3, FIG. 4, and FIG. 7, the fixing member 31 includes an elongated beam 311, two soldering tails 312 respectively and curvedly extending from two opposite ends of the beam 311, and two aligning tails 313 curvedly extending from the beam 311. The beam 31 is arranged in the accommodating slot 121 of the end portion 12. The two soldering tails 312 extend from the beam 311 and out of the accommodating slot 121 of the end portion 12 along two opposite directions. Each of the two soldering tails 312 is in an L shape, and an end part of each of the soldering tails 312 has a width that is preferably larger than a width of an adjacent part of each of the soldering tails 312.

The two aligning tails 313 are respectively connected to two opposite long sides of the beam 311, and are movably inserted into the bottom of the accommodating slot 121 of the end portion 12. In the present embodiment, the two aligning tails 313 respectively pass through the two thru-holes 122 of the end portion 12, and each of the two aligning tails 313 does not contact with an inner wall defining the corresponding thru-hole 122, but the present disclosure is not limited thereto.

The soldering tail 312 in the present embodiment is a structure applicable to a surface mounting technology, but the present disclosure is not limited thereto. In other embodiments of the present disclosure, the soldering tail 312 can be a structure being applicable for being inserted into and soldered with a circuit board.

In addition, the number of the aligning tails 313 of the fixing member 31 and the number of the thru-holes 122 of the end portion 12 in the present embodiment are each two, but the present disclosure is not limited thereto. For example, in other embodiments of the present disclosure, the number of the aligning tails 313 of the fixing member 31 and the number of the thru-holes 122 of the end portion 12 in the present embodiment can each be at least one.

As shown in FIG. 3, FIG. 4, and FIG. 7, the limiting member 32 includes a frame 321 and two elastic arms 322 connected to the frame 321. The frame 321 is fixed on the end portion 12 of the insulating housing 1, and the frame 321 in the present embodiment is engaged with and abutted against a top surface of the insulating housing 1, but the present disclosure is not limited thereto. Moreover, the two elastic arms 322 are respectively arranged above the two soldering tails 312 of the fixing member 31. The two elastic arms 322 in the present embodiment slantingly extend from the frame 321 toward the two soldering tails 312, respectively, so that at least part of each of the two elastic arms 322 is arranged in the accommodating slot 121.

The floating connector 100 before being soldered onto any objects has been disclosed in the above description. The floating connector 100 in the present embodiment can be fixed (or soldered) onto a circuit board 200, and the floating connector 100 and the circuit board 200 can be jointly defined as a signal transmission assembly shown in FIG. 8 to FIG. 11. It should be noted that, the floating connector 100 of the present embodiment is in cooperation with the circuit board 200, but the floating connector 100 in other embodiments of the present disclosure can be independently sold or can be sold together with other components.

In order to distinguish the floating connector 100 soldered on the circuit board 200 from the floating connector 100 not soldered on the circuit board 200, the following description discloses a soldering process of the floating connector 100.

As shown in FIG. 8 to FIG. 11, the floating connector 100 of the present embodiment is disposed on the circuit board 200, and the soldering segments 223 of the conductive terminals 2 and the soldering tails 312 of the two fixing members 31 are respectively disposed on a plurality of contacts of the circuit board 200. Then, a soldering step is implemented so as to fix the floating connector 100 onto the circuit board 200. It should be noted that, the signal transmission path P1 can be defined by a length of the conductive terminal 2 from a position of the soldering segment 223 fixed on the corresponding contact and arranged adjacent to the S-shaped elastic segment 222 to a position of the contacting segment 211 abutted against a terminal of the mating connector. The frequency adjusting path P2 can be defined by a length of the conductive terminal 2 that extends from the position of the soldering segment 223, which is fixed on the corresponding contact and arranged adjacent to the S-shaped elastic segment 222, to an edge of the extending segment 221 connected to the fixing segment 212.

Figure 10:
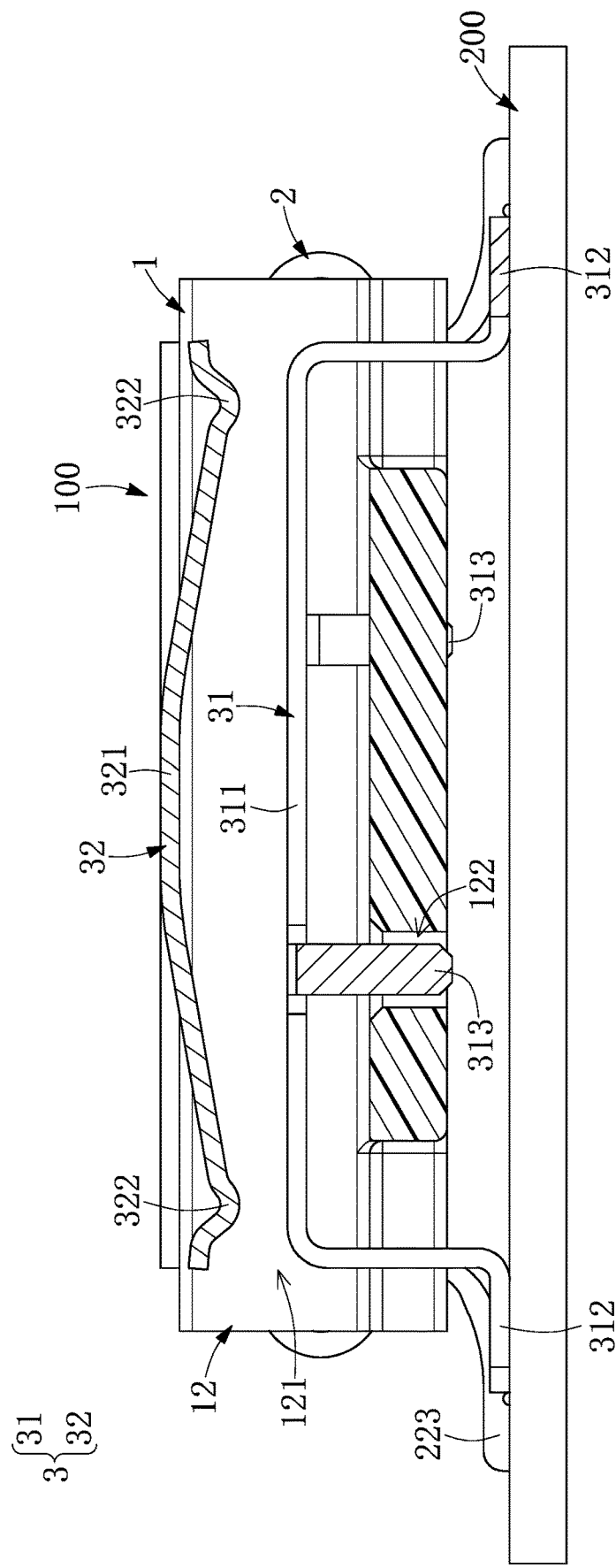
FIG. 10 is a cross-sectional view taken along the cross-sectional line X-X of FIG. 8.
Figure 11:
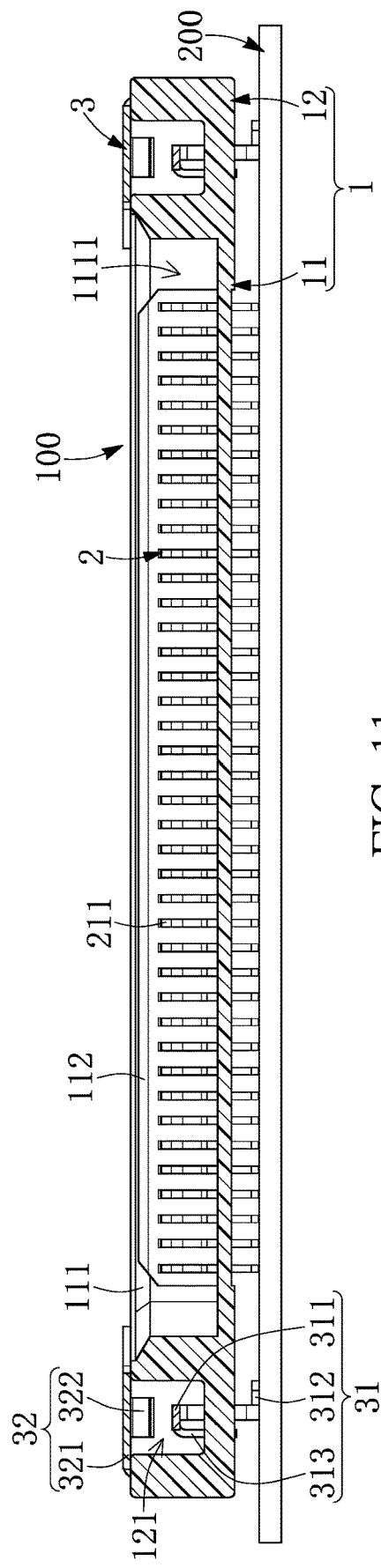
FIG. 11 is a cross-sectional view taken along the cross-sectional line XI-XI of FIG. 8.

Before the floating connector 100 is soldered onto the circuit board 200 (as shown in FIG. 7), the beam 311 of each of the fixing members 31 is disposed on the bottom of the accommodating slot 121 of the corresponding end portion 12, and a bottom of each of the soldering tails 312 is lower than a bottom of the soldering segment 223 of each of the conductive terminals 2. When the bottom of each of the soldering tails 312 is disposed on the circuit board 200 (as shown in FIG. 10), the beam 311 of each of the fixing members 31 is upwardly moved to separate from the bottom of the accommodating slot 121 of the corresponding end portion 12, so that the beam 311 of each of the fixing members 31 does not contact with the corresponding end portion 12, and each of the aligning tails 313 is moved in the corresponding thru-hole 122.

In addition, each of the limiting members 32 is located at one side of the corresponding fixing member 31 away from the circuit board 200, so that when the floating connector 100 is disposed on the circuit board 200, each of the limiting members 32 can be used to prevent the corresponding fixing member 31 from falling off the corresponding end portion 12. In other words, each of the limiting members 32 can limit an upward movement of the corresponding fixing member 31, so that a part of each of the aligning tails 313 of the corresponding fixing member 31 can be maintained to be disposed in the corresponding thru-hole 122.

The soldering process of the floating connector 100 has been disclosed in the above description, and the following description discloses the structure and relationship connection of each component of the signal transmission assembly.

As shown in FIG. 8 to FIG. 11, the soldering segments 223 of the conductive terminals 2 and the soldering tails 312 of the two fixing members 31 are soldered onto the circuit board 200, so that the insulating housing 1 can be spaced apart from the circuit board 200. Accordingly, when the insulating housing 1 is moved relative to the circuit board 200, the S-shaped elastic segment 222 of each of the conductive terminals 2 and the beam 311 and the two soldering tails 312 of each of the two fixing members 31 can be pressed to provide a returning force to the insulating housing 1, so that the signal transmission assembly (or the floating connector 100) can be provided with a better shockproof effect.

In conclusion, the signal transmission assembly or the floating connector 100 of the present disclosure is provided with not only a better shockproof effect, but also the capability to transmit a high-frequency signal satisfying the SAS 3.0 standard by the structural design of each of the conductive terminals 2 (e.g., the length of the frequency adjusting path is 40%-60% of the length of the signal transmission path).

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A signal transmission assembly, comprising:
   a circuit board; and
   a floating connector fixed on the circuit board, wherein the floating connector includes:
      an insulating housing having an inserted groove; and
      a plurality of conductive terminals each having a first portion and a second portion extending from the first portion, wherein the first portion of each of the conductive terminals is inserted into the insulating housing and includes a contacting segment that is at least partially exposed from the inserted groove, the second portion of each of the conductive terminals does not contact with the insulating housing and includes a soldering segment, and the soldering segments of the conductive terminals are soldered on the circuit board,
   wherein in each of the conductive terminals, a signal transmission path is defined between the contacting segment and the soldering segment, a frequency adjusting path is defined between the soldering segment and a position of the second portion that is connected to the first portion, and a length of the frequency adjusting path is 40%-60% of a length of the signal transmission path, so that each of the conductive terminals is configured to transmit a high-frequency signal satisfying the SAS 3.0 standard.

2. The signal transmission assembly according to claim 1, wherein the insulating housing includes an inserted portion having the inserted groove and two end portions respectively connected to two opposite ends of the inserted portion, and the first portions of the conductive terminals are inserted into the inserted portion, wherein the floating connector includes two fixing modules respectively fastened to the two end portions, the insulating housing and the circuit board are spaced apart from each other, and each of the two fixing modules includes a fixing member and a limiting member, and wherein in each of the two fixing modules, the fixing member is movably inserted into the corresponding end portion and is soldered on the circuit board, and the limiting member is fixed on the corresponding end portion and is located at one side of the fixing member away from the circuit board.

3. The signal transmission assembly according to claim 2, wherein each of the two end portions has an accommodating slot, and an opening of the accommodating slot of each of the two end portions and an opening of the inserted groove face the same side, and wherein in each of the two fixing modules, the fixing member is movably inserted into a bottom of the accommodating slot of the corresponding end portion, and the limiting member covers at least part of the opening of the accommodating slot of the corresponding end portion.

4. The signal transmission assembly according to claim 3, wherein the fixing member of each of two fixing modules includes:
   a beam arranged in the accommodating slot of the corresponding end portion;
   two soldering tails respectively and curvedly extending from two opposite ends of the beam and out of the accommodating slot of the corresponding end portion; and
   at least one aligning tail curvedly extending from the beam and movably inserted into the bottom of the accommodating slot of the corresponding end portion.

5. The signal transmission assembly according to claim 4, wherein in each of two fixing modules, the limiting member includes:
   a frame fixed on the insulting housing; and
   two elastic arms connected to the frame and respectively arranged above the two soldering tails of the fixing member.

6. A floating connector for the SAS 3.0 standard, comprising:
   an insulating housing having an inserted groove; and
   a plurality of conductive terminals each having a first portion and a second portion extending from the first portion, wherein the first portion of each of the conductive terminals is inserted into the insulating housing and includes a contacting segment that is at least partially exposed from the inserted groove, and the second portion of each of the conductive terminals does not contact with the insulating housing and includes a soldering segment,
   wherein in each of the conductive terminals, a signal transmission path is defined between the contacting segment and the soldering segment, a frequency adjusting path is defined between the soldering segment and a position of the second portion that is connected to the first portion, and a length of the frequency adjusting path is 40%-60% of a length of the signal transmission path, so that each of the conductive terminals is configured to transmit a high-frequency signal satisfying the SAS 3.0 standard.

7. The floating connector according to claim 6, wherein in each of the conductive terminals, the second portion includes an extending segment connected to the first portion and an S-shaped elastic segment connecting the extending segment and the soldering segment, and the extending segment and the S-shaped elastic segment are elastically deformable and movable with respect to the first portion and the soldering segment.

8. The floating connector according to claim 7, wherein in each of the conductive terminals, the S-shaped elastic segment includes a first curved segment and a second curved segment connected to the first curved segment, the first curved segment is connected to the extending segment, the second curved segment is connected to the soldering segment, and a radius of curvature of the first curved segment is 90%-110% of a radius of curvature of the second curved segment.

9. The floating connector according to claim 6, wherein each of the conductive terminals is integrally formed as a single stamped piece without stretching or folding any surfaces of the conductive terminals.

10. A conductive terminal of a floating connector integrally formed as a single punched piece without stretching or folding any surfaces of the conductive terminal, the conductive terminal comprising:
   a first portion including a contacting segment for being abutted against a mating terminal; and
   a second portion extending from the first portion, wherein the second portion includes a soldering segment for being soldered on a circuit board,
   wherein a signal transmission path is defined between the contacting segment and the soldering segment, a frequency adjusting path is defined between the soldering segment and a position of the second portion that is connected to the first portion, and a length of the frequency adjusting path is 40%-60% of a length of the signal transmission path, so that each of the conductive terminals is configured to transmit a high-frequency signal satisfying the SAS 3.0 standard.

\* \* \* \* \*